United States Patent [19]
Ohsawa et al.

[11] Patent Number: 5,777,542
[45] Date of Patent: Jul. 7, 1998

[54] MAGNETORESISTANCE EFFECT DEVICE AND MANUFACTURING METHOD THEREOF

[75] Inventors: Yuichi Ohsawa, Tokyo; Hiroaki Yoda, Kawasaki, both of Japan

[73] Assignee: Kabushiki Kaisha Toshiba, Kanagawa-ken, Japan

[21] Appl. No.: 702,894

[22] Filed: Aug. 26, 1996

[30] Foreign Application Priority Data

Aug. 28, 1995 [JP] Japan .................... 7-219200

[51] Int. Cl.⁶ .................................... H01L 43/00
[52] U.S. Cl. .................... 338/32 R; 360/113; 29/603.08
[58] Field of Search ............... 338/32 R, 65, 338/315, 328; 360/113; 29/603.08, 603.13, 603.14, 603.15

[56] References Cited

U.S. PATENT DOCUMENTS

| | | | |
|---|---|---|---|
| 5,371,643 | 12/1994 | Yuito et al. | 360/113 |
| 5,432,734 | 7/1995 | Kawano et al. | 360/113 X |
| 5,442,507 | 8/1995 | Koga et al. | 360/113 |
| 5,549,978 | 8/1996 | Iwasaki et al. | 428/692 |
| 5,552,949 | 9/1996 | Hashimoto et al. | 360/113 |
| 5,585,199 | 12/1996 | Kamiguchi et al. | 428/621 |

FOREIGN PATENT DOCUMENTS

| | | |
|---|---|---|
| 6-103533 | 4/1994 | Japan . |
| 6-325934 | 11/1994 | Japan . |

*Primary Examiner*—Edward Tso
*Attorney, Agent, or Firm*—Finnegan, Henderson, Farabow, Garrett & Dunner, L.L.P.

[57] ABSTRACT

In a magnetoresistance effect device that has leads, a magnetic gap layer, and a magnetic shield layer that are laminated on a magnetoresistance effect film, an insulation film is formed on a main surface at the edge portions of the leads (namely, on a non-tapered surface). Thus, a film quality deteriorated region of the magnetic gap layer is spaced apart from an electric field concentrated portion. In addition, the insulation film has a mask layer on a conductor layer formed on the magnetoresistance effect film. When a pair of leads are formed by the ion-milling process, a magnetic gap layer is formed with the mask layer on the non-tapered surface of the leads. Thus, since an insulation film is formed at the edge portions of the leads, the lower corner portion of the magnetic gap layer becomes an edge portion of the insulation film. In this portion, the deterioration of the film quality is inevitable. However, the electric field concentrated portion is still the edge portions of the leads. Thus, since the film quality deteriorated portion is spaced apart from the electric field concentrated portion, the dielectric breakdown hardly takes place.

10 Claims, 9 Drawing Sheets

TRACK WIDTH

MAGNETIC FIELD
OF MEDIUM

FIG. 9B

MAGNETIC
FIELD OF
MEDIUM

SLIDER

FIG. 10

GIMBAL

SUSPENSION

HEAD GIMBAL ASSEMBLY

MAGNETORESISTANCE EFFECT DEVICE AND MANUFACTURING METHOD THEREOF

BACKGROUND OF THE INVENTION

1. Field of the Invention

The present invention relate to a magnetoresistance effect device for use with a reproducing head of a magnetic disk drive (hard disk drive) and a manufacturing method thereof.

2. Description of the Related Art

In recent years, since a magnetoresistance effect device using the magnetic field dependency of an electric resistance in the anisotropic magnetoresistance effect (AMR) of for example NiFe alloy or in the giant magnetoresistance effect (GMR) of the spin dependent scattering of adjacent magnetic layers through a non-magnetic layer has high sensitivity, it is being intensively studied for applications to a reproducing head of a magnetic disk drive and so forth.

A pair of leads for supplying a current are formed on the magnetoresistance effect film that has the magnetoresistance effect. A portion surrounded by the leads functions as a magnetic field sensible portion. A magnetic shield layer is formed on the surface of the magnetic field sensible portion through a magnetic gap layer composed of an insulator.

Form a view point of high density recording, the magnetic gap layer of a reproducing head for used with a HDD should be as thin as possible (in other words, the reproducing head should have a narrow gap).

However, the film quality of the magnetic gap layer that is formed above the leads and the magnetoresistance effect film is sparse (thereby, deteriorates) at the edge portions of the leads. The electric field concentrates at the edge portions of the leads between the magnetic shield layer and the leads. Thus, the film quality deteriorated portion of the magnetic gap layer, which is an insulator, accords with the electric field concentrated portion. Consequently, in this portion, a dielectric breakdown tends to occur. In other words, it is difficult to thin the magnetic gap layer.

In addition, when the leads are formed by an etching process such as a lift-off process, the pattern edges tend to burr. Thus, the ion milling process is preferably used. However, after the ion milling process is performed, when the resist is peeled off, a re-adhered substance layer composed of a mixture of the resist and the milling material causes burring. Thus, the dielectric breakdown may take place.

As described above, the deterioration of the film quality of the magnetic gap layer at the edge portions of the leads tends to cause the dielectric breakdown. Thus, the reliability of the magnetoresistance effect device will degrade.

SUMMARY OF THE INVENTION

The present invention is made from the above-described point of view. An object of the present invention is to provide a magnetoresistance effect device that suppress the dielectric breakdown at the edge portions of the leads and improves the reliability thereof.

A first aspect of the present invention is a magnetoresistance effect device, comprising a magnetoresistance effect film, a pair of leads composed of a conductor layer for supplying a current to the magnetoresistance effect film, an insulation film formed in at least edge portions of the leads oppositely formed, a magnetic gap layer for coating the surface of the magnetoresistance effect film formed between the leads and the insulation film, and a magnetic shield layer formed on the magnetic gap layer.

In other words, since the insulation layer is formed at the edge portions of the leads, the corner portions below the magnetic gap layer become the edge portions of the insulation film. Although the deterioration of the film quality at these portions is inevitable, the electric field concentrated portion is still the edge portions of the leads. Thus, the film quality deteriorated portion is spaced apart from the electric file concentrated portion, the dielectric breakdown hardly takes place.

Figure 1A:
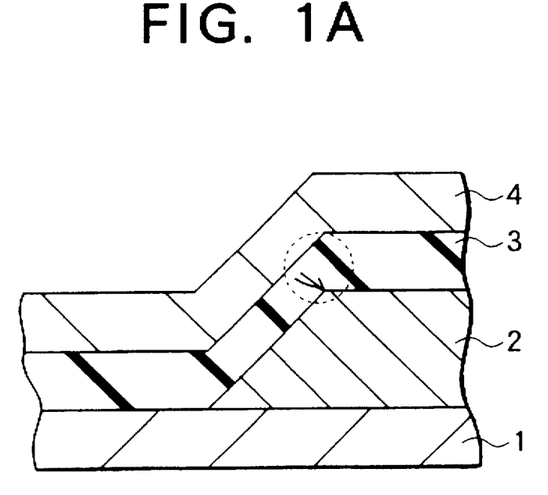
FIGS. 1A and 1B are sectional views for explaining a magnetoresistance effect device according to the present invention.
Figure 1B:
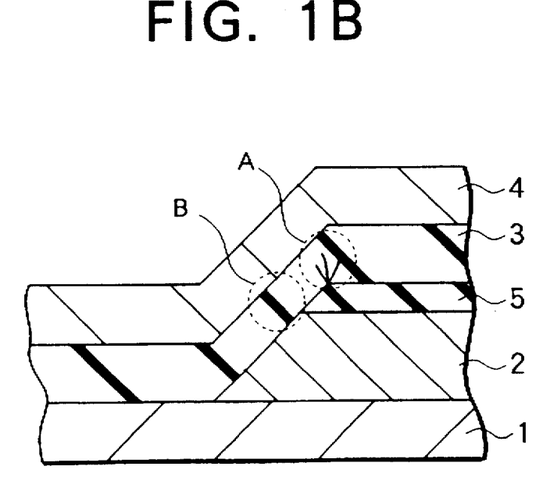

FIGS. 1A and 1B are sectional views showing principal portions of a magnetoresistance effect devices. The magnetoresistance effect device shown in FIG. 1A does not have an insulation film. A lead (2), a magnetic gap layer (3), and a magnetic shield layer (4) are laminated on a magnetoresistance effect film (1). In this structure, the film quality deteriorated region of the magnetic gap layer at the edge portion of the lead (denoted by a dotted circle) accords with the lead (namely, the electric field concentrated portion at the corner of the conductor portion). In this region, the dielectric breakdown tends to occur.

FIG. 1B shows the structure of a magnetoresistance effect device according to the present invention. In FIG. 1B, since an insulation film (5) is formed on the main surface of the edge portion of a lead (2) (namely, on a non-tapered surface), the film quality deteriorated region (region A denoted by a dotted circle) of a magnetic gap layer (3) is different from an electric field concentrated portion (region B denoted by another dotted circle). Thus, the dielectric breakdown hardly takes place.

A second aspect of the present invention is a manufacturing method of a magnetoresistance effect device, comprising the steps of (a) forming a conductor layer on a magnetoresistance effect film, (b) forming a mask layer composed of an insulation layer with a predetermined pattern on the conductor layer, (c) ion-milling the conductor layer with the mask layer so as to form the conductor layer in a lead shape, (d) forming a magnetic gap layer composed of a non-magnetic substance so as to coat the magnetoresistance effect film exposed in the step (c) and the remaining mask layer, and (e) forming a magnetic shield layer composed of a magnetic substance on the magnetic gap layer.

Since the mask layer remains after the magnetic gap layer is formed, as described above, the film quality deteriorated portion of the magnetic gap layer can be spaced apart from the electric field concentrated portion. Thus, the dielectric breakdown hardly takes place.

The magnetoresistance effect film according to the present invention can be applied for both AMR and GMR. An example of AMR is a permalloy film. An example of GMR is a laminate of a ferromagnetic layer and a conductive nonmagnetic layer (Cu, Au, Ag, or the like). Examples of GMR type are a metal artificial lattice type (of which an antiferromagnetic exchange bond is present between adjacent ferromagnetic layers) and a spin valve type (of which an exchange bond is-not substantially present between adjacent ferromagnetic layers).

Among these, since the GMR type magnetoresistance effect film has a large MR value, this film is effective. The magnetic layer that has such a sandwich structure can be composed of Co, Fe, Ni, or an alloy thereof. The magnetic layer may contain a non-magnetic element such as Pd, Al, Cu, Ta, In, B, Nb, Hf, Mo, W, Re, Ru, Rh, Ga, Zr, Ir, Au, or Ag. The non-magnetic layer can be composed of Cu, Au, Ag, or the like.

When a magnetic alloy $Co_{100-x}Fe_x$ (where $0 < x \leq 40$ atomic %) is used, the MR value is particularly high and effective.

The spin valve type has a pin layer (of which the magnetization is hardly rotated by a signal magnetic field) and a free layer (of which the magnetization is easily rotated by the signal magnetic field). In this case, a magnetic alloy $Co_{100-x}Fe_x$ (where $0<x\leq 40$ atomic %) can be effectively used as the free layer. When a Co alloy is used, a high heat resistance is obtained. As disclosed in Japanese Patent Laid-Open Publication No. 6-325934, with (111) orientation, the sensitivity can be improved.

Generally, the magnetoresistance effect film has a magnetic bias layer. The magnetic bias layer is used for example to reduce the Barkhausen noise and control the orientation of the magnetization. The magnetoresistance effect device according to the present invention may include the magnetic bias layer. Thus, the lead is not necessarily directly formed on a film that has the magnetoresistance effect. In other words, a conductor film (for example, a conductive magnetic bias layer) may be disposed between the magnetoresistance effect film and the lead. In each case, the effect of which the film quality deteriorated portion of the magnetic gap layer is spaced apart from the electric field concentrated portion can be obtained.

As an example of the magnetic bias layer, an antiferromagnetic film such as FeMn or IrMn can be used. Thus, by the magnetic exchange bond of the antiferromagnetic film, a magnetic bias can be applied. Alternatively, by a method using a hard magnetic film with a high coercive force such as CoPt or by a magnetic layer connected to a hard magnetic layer (for example, an amorphous magnetic alloy or permalloy), a magnetic bias can be applied.

In the case of the spin valve type, an antiferromagnetic film may be used for a magnetic bias layer for fixing the magnetization of the pin layer. To control the orientation of the magnetization of the free layer, a magnetic layer connected to a hard magnetic layer may be used. Thus, in the state that a signal magnetic field is absent, the orientation of the magnetization of the pin layer accords with the direction of the signal magnetic field. The orientation of the magnetization of the free layer is placed in the initial state at an angle of 90° against the orientation of the magnetization of the pin layer.

A mask film used in the manufacturing method of the magnetoresistance effect device according to the present invention should have an ion milling resistance. Examples of the material of the mask film are Al oxide, Si oxide, Ti oxide, Zr oxide, Al nitride, Si nitride and Ta nitride.

Further, the above-described mask film is not limited to a one-layered film. A laminated film may be used. For example, a laminated film composed of an alumina layer as an upper layer and a silica layer as a lower layer may be used as the mask film. This laminated film is effective to produce a smooth slope of a shape after milling. That is, the slope which is formed by the laminated mask film and the lead is smoother than that of the one-layered mask film, because the milling rate of silica is close to that of a lead material such as Cu, compared with that of alumina. In this case, the patterning of both layers as a mask is not necessary. The patterning of the upper alumina layer only is allowed as a mask.

In addition, to prevent a film formed after a lead is formed from being stepwise cut at the edge portion of the lead, the ion milling process is preferably performed at an angle of 2° to 80° from the vertical direction against the film surface so as to taper the side surface of the lead.

In this case, the lead distance should be as narrow as possible for accomplishing a narrow track structure.

However, when the thickness of the mask layer is larger than the lead distance, due to the shadow of the mask layer, the etching rate of the conductor layer at the portion surrounded by the leads may be smaller than that of the outer region. Thus, the leads are not separately formed and thereby the characteristics of the magnetoresistance effect device may not be obtained. Consequently, the film thickness of the mask layer should be satisfactorily smaller than the lead distance.

For a high density recording of 3 Gbis or more, the lead distance should be around 1 μm or less. Thus, the thickness of the mask layer is preferably around 300 nm or less. In addition, since the remaining film thickness after the milling process accords with the distance between the film quality deteriorated portion and the electric field concentrated portion of the magnetic gap layer, the remaining film thickness after the milling process should be around 5 nm or more.

Examples of the material of the leads are conductors such as Cu, Au, Al, Mo, MoTa alloy, and MoW alloy. However, to improve the adhesive strength with the adjacent layer and form a diffusion preventing barrier, a laminate with a top layer of Cr, Ti, or Ta may be formed.

The magnetic gap layer should have non-magnetic and electric insulation characteristics. Examples of the material of the magnetic gap layer are inorganic oxides/nitrides such as Si oxide, Zr oxide, Ti oxide, alumina, aluminum nitride. For a narrow gap structure, the fill thickness is preferably around 100 nm or less. However, to accomplish a good insulation characteristic, the film thickness is preferably around 10 nm or more.

On the main surface of the leads, two layers of an insulation layer (as a remaining mask layer) and a magnetic gap layer are formed. Thus, even if a pin hole is inevitably formed in the film forming process, due to the dual-layer structure, the probability of which the magnetic shield layer and the leads get shortcircuited is very low.

The magnetic shield layer should be a magnetic substance with high magnetic permeability and high saturated magnetic flux density. An example of the magnetic shield layer is an amorphous magnetic alloy film.

Figure 9A:
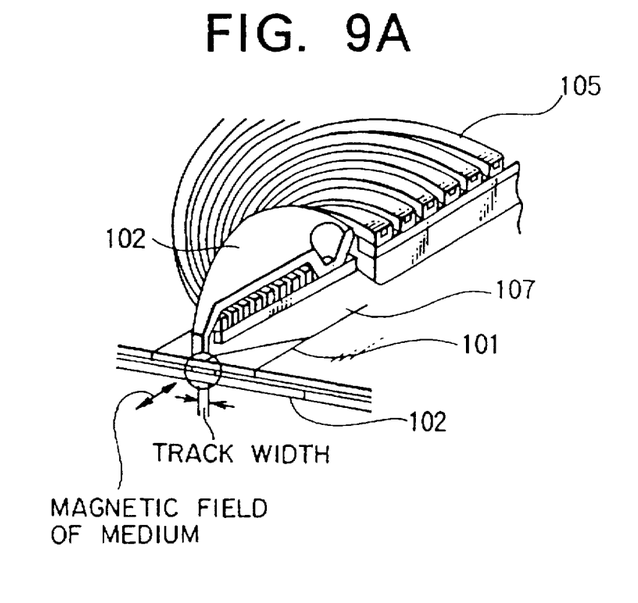
FIGS. 9A and 9B are outlined views for explaining an integrated recording/reproducing head according to the present invention.
Figure 9B:
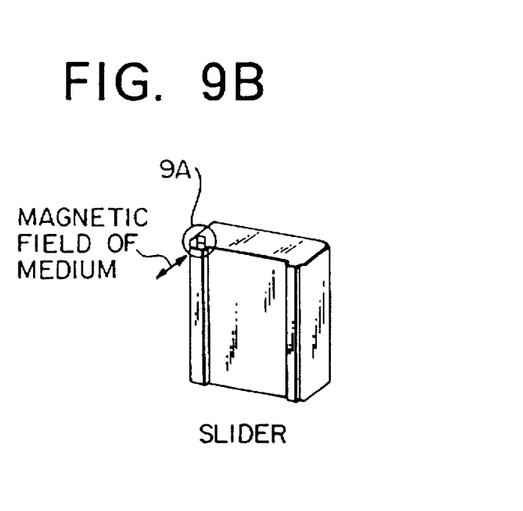
Figure 10:
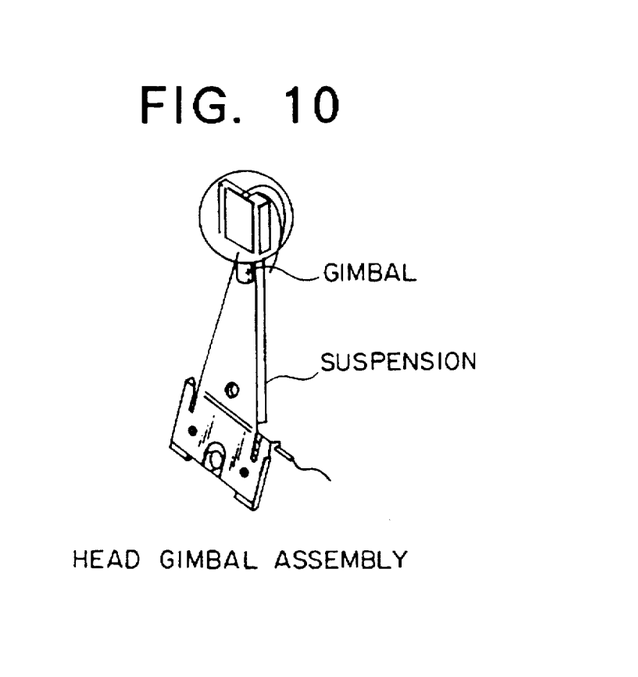
FIG. 10 is an outlined view for explaining a magnetic head assembly according to the present invention.

When a coil and so forth are formed on the magnetic shield by the film forming process, a recording head can be produced. Thus, an integrated recording/reproducing head can be formed. FIGS. 9A, 9B, and 10 show an example of the integrated recording/reproducing head. FIG. 9A is an outlined perspective view showing the integrated recording/reproducing head. A write head having a coil (105) formed between upper and lower magnetic poles (102 and 107) is disposed on a magnetoresistance effect device sandwiched by upper and lower shields (101 and 108) (see FIG. 9A). After a protecting film composed of for example alumina is formed, the head is formed in a slider shape (see FIG. 9B). Thereafter, the head is adhered to a gimbal mounted on a suspension. Thus, a head gimbal assembly is obtained (see FIG. 10). Thereafter, the head is assembled to a magnetic disk drive.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Next, with reference to the accompanying drawings, embodiments of the present invention will be described.

First Embodiment

Figure 2:
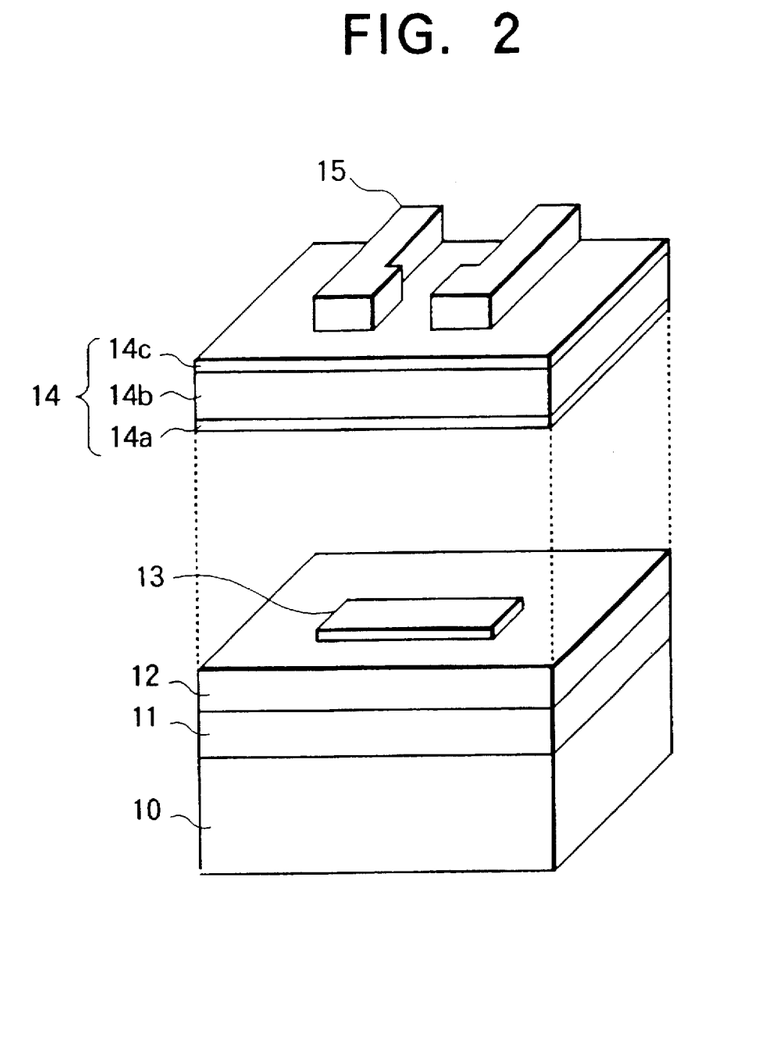
FIG. 2 is an outlined perspective view for explaining a magnetoresistance effect device according to a first embodiment of the present invention.
Figure 3A:
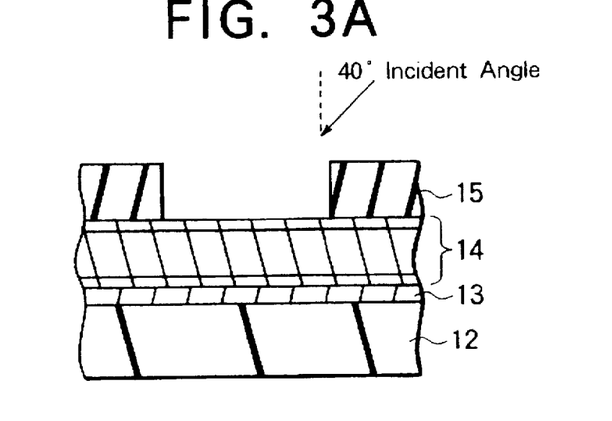
FIGS. 3A, 3B, and 3C are outlined sectional views for explaining manufacturing steps of the magnetoresistance effect device according to the first aspect of the present invention.
Figure 3B:
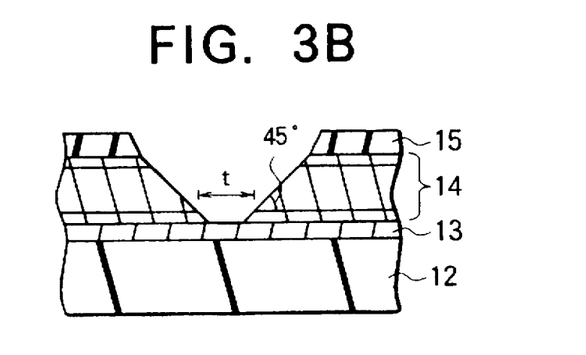
Figure 3C:
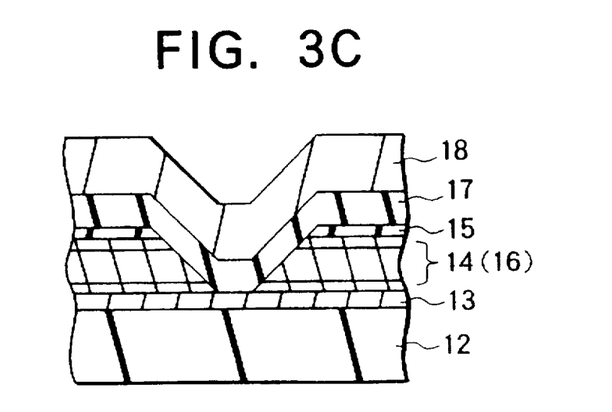

FIG. 2 is an outlined perspective view for explaining a magnetoresistance effect device according to an embodiment of the present invention. FIGS. 3A, 3B, and 3C are sectional views showing principal portions of the magnetoresistance effect device according to the embodiment of the present invention.

A CoZrNb amorphous magnetic alloy layer with a thickness of 2 µm is formed as a lower shield layer (11) on a substrate (10) composed of alumina-titanium-carbide (ALTIC) mixture ceramics. An alumina layer with a thickness of 0.1 µm is formed as a lower gap layer (12) on the lower shield layer (11).

A stripe shaped magnetoresistance effect film (13) is formed on the lower gap layer (12). The magnetoresistance effect film (13) is for example a permalloy single layer film or a spin valve type magnetoresistance effect film having a sandwich structure of ferromagnetic layer/non-magnetic layer/ferromagnetic layer.

A conductor layer (14) is formed on the magnetoresistance effect film (13). The conductor layer (14) is composed of a Ta layer (14a) with a thickness of 10 nm, a Cu layer (14b) with a thickness of 80 nm, and a Ta layer (14c) with a thickness of 20 nm that are deposited in the order. The major portion of the conductor layer (14) is the Cu layer (14b). The Ta layer (14a) causes the adhesive strength of the conductor layer (14) and the magnetoresistance effect film (13) to be improved. The Ta layer (14c) causes the adhesive strength of a mask layer (15) (that will be described later) and the conductor layer (14) to be improved.

Thereafter, the mask layer (15) composed of alumina with a thickness of 100 nm is formed on the conductor layer (14). The conductor layer (15) is patterned by the reactive ion etching method (RIE) with for example a carbon fluoride type gas so that leads with a distance of 1 µm are formed (see FIGS. 2 and 3A). The RIE process may be stopped on the Ta layer or the Cu layer.

Thereafter, with the patterned alumina mask layer (15), the conductor layer (14) is ion-milled. Thus, leads (16) are formed. When the conductor layer (14) is ion-milled, the ion incident angle is 40°. After the conductor layer (14) is ion-milled, the distance (t) of the conductor layers (14) contacting the magnetoresistance effect film (13) is 1.0 µm. The side surfaces of the leads (16) are tapered for around 45°. After the ion-milling process is performed, the thickness of the remaining film of the mask layer (15) is around 20 nm (see FIG. 3B). Thus, the upper shape of each of the leads (16) is almost the same as the shape of the mask layer (15) in at least the portion surrounded by the leads and the edge portions of the leads (16).

By selecting the milling angle, the selecting rates of the mask material and the lead material can be controlled. Thus, the taper angle can be controlled. When an aluminum mask and a Ta lead are used, at an ion incident angle of 40°, since they have the same milling rate (at around 500 V), a taper angle of around 45° can be obtained.

When a Si oxide mask and a Cu mask are used, at an ion incident angle of 60°, a taper angle of around 45° can be obtained. Since the milling selecting rate with a Ti spin valve protecting film is around 3, both a good taper angle and a good milling depth distribution can be accomplished.

An alumina layer with a thickness of around 60 nm is formed as an upper gap layer (17) [magnetic gap layer]. Thus, a gap length (distance from the free layer to the upper shield layer) of 0.1 µm can be accomplished. At this point, since the remaining mask layer (15) is used, not peeled off, no burring takes place.

Thereafter, a CoZrNb amorphous magnetic alloy layer with a thickness of around 2.0 µm is formed as an upper shield layer (18) [magnetic shield layer] on the upper gap layer (17) (see FIG. 3C).

With the above-described manufacturing steps, a shield type MR head is obtained. With such a structure, the film quality deteriorated portion of the magnetic gap layer is present at the edge portions of the remaining mask layers (15). In addition, the electric field concentrated region is present at the edge portions of the leads (16). Thus, the film quality deteriorated portion does not accord with the electric field concentrated region.

Experimental results of characteristics of the resultant reproducing head show that although the thickness of the magnetic gap layer (17) of the magnetoresistance effect film is as small as 60 nm, the electric insulation characteristic among the upper gap layer (17), the magnetoresistance effect film (13), and the leads (16) is good and thereby the resultant reproducing head has a very high reliability. In addition, the experimental results show that a reproducing track with of 1 µm can be accomplished.

Moreover, when the ion incident angle is 20° to 80°, a gap length of 0.1 µm can be accomplished. Furthermore, by changing the conditions, a track width of 0.7 µm can be also accomplished.

Second Embodiment

Figure 4:
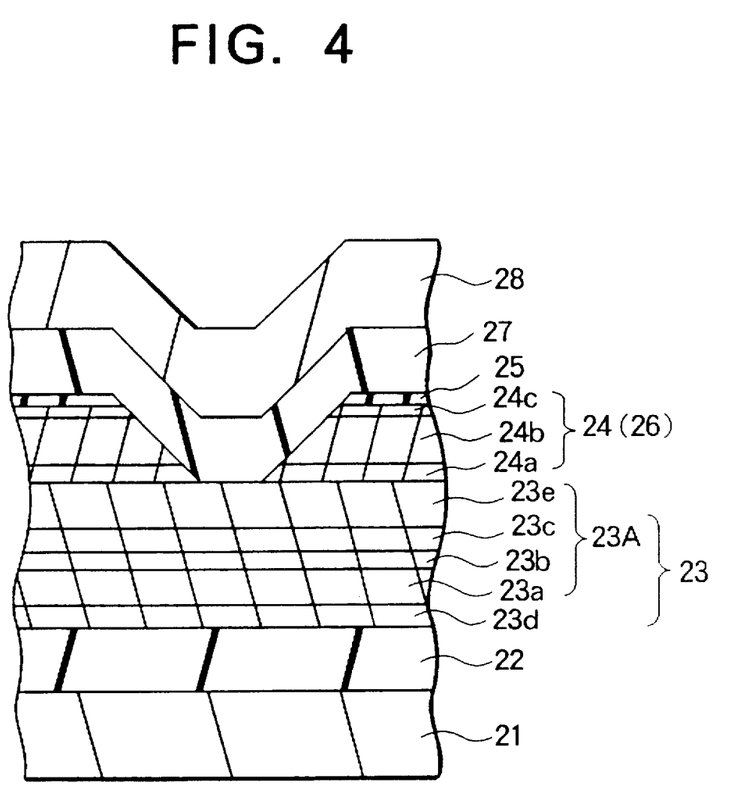
FIG. 4 is an outlined sectional view for explaining a magnetoresistance effect device according to a second embodiment of the present invention.

FIG. 4 is a sectional view showing principal portions of a magnetic reproducing head (MR head) according to a second embodiment of the present invention.

As with the first embodiment, a lower shield layer (21) is formed on a substrate (not shown). An alumina layer with a thickness of 75 nm is formed as a lower gap layer (22) on the lower shield layer (21).

A stripe shaped magnetoresistance effect film (23) is formed on the lower gap layer (22). The magnetoresistance effect film (23) is formed in a sandwich structure of a pin layer (CoFe alloy with a thickness of 2 nm) (23a), a nonmagnetic layer (Cu with a thickness of 3 nm) (23b), a free layer (CoFe alloy with a thickness of 2 nm) (23c) deposited in the order. In addition, an antiferromagnetic film (23d) composed of nickel oxide with a thickness of 15 nm is formed as a magnetic bias layer for the pin layer (23a) on the pin layer (23a). A magnetic layer (23e) composed of CoZrNb amorphous magnetic alloy with a thickness of 10 nm is formed as a magnetic bias layer for the free layer (23c) on the free layer (23c).

A conductor layer (24) is formed on the magnetoresistance effect film (23). The conductor layer (24) is formed by depositing a CoPt layer with a thickness of 20 nm as a hard magnetic layer (24a) for supplying a bias magnetic field to the magnetic layer (23e), a Cu layer (24b) with a thickness of 80 nm, and a Ta layer (24c) with a thickness of 20 nm in the order.

Thereafter, as with the first embodiment, a mask layer (25) composed of alumina with a thickness of 100 nm is formed. With the patterned alumina mask layer (25), the conductor layer (24) is ion-milled. As a result, leads (26) are formed. In the ion-milling process, the ion incident angle is 40° and the distance between the leads (26) that contact the magnetoresistance effect film (23) is 1.0 µm. The side surfaces of the leads (26) are tapered for around 45°. After the ion-milling process, the remaining film thickness of the mask layer (25) is around 20 nm.

Thereafter, an alumina layer with a thickness of around 0.1 µm is formed as an upper gap layer (27) [magnetic gap layer]. A CoZrNb amorphous magnetic alloy layer with a thickness of around 2 µm is formed as an upper shield layer (28) [magnetic shield layer] on the upper gap layer (27).

With the above-described manufacturing steps, a shield type MR head is obtained (see FIG. 4).

Experimental results of characteristics of the reproducing head show that although the thickness of the magnetic gap layer is as small as 0.1 µm, the electric insulation characteristic among the upper gap layer (27), the magnetoresistance effect film (23), and the leads (26) is good and thereby the resultant reproducing head has a very high reliability. In addition, the experimental results show that a reproducing track width of 1 µm can be accomplished. Moreover, since the leads and the hard magnetic film are patterned on the self-alignment basis, their positions can be precisely defined. Furthermore, the experimental results show that the offtrack characteristics are good.

Third Embodiment

In the second embodiment, the hard magnetic layer (24a) is formed above the magnetoresistance effect film (23). However, the hard magnetic layer can be also formed below the magnetoresistance effect film. This structure will be described as a third embodiment of the present invention.

FIGS. 5A, 5B, 5C, 5D and 6 are sectional views showing principal portions of a magnetoresistance effect device according to the third embodiment of the present invention.

As with the first embodiment, a lower shield layer (31) is formed on a substrate (not shown). An alumina layer with a thickness of around 0.1 µm is formed as a lower gap layer (32) on the lower shield layer (31). CoPt layers with a thickness of around 20 nm and a distance (d) of 3 µm are formed as hard magnetic layers (39) on the lower gap layer (32) (see FIG. 5A).

As with the second embodiment, a magnetoresistance effect film (33) is formed on the hard magnetic layer (39). For simplicity, each portion of the magnetoresistance effect film (33) is not shown. A magnetic layer (corresponding to reference numeral 23e in FIG. 4) is formed as a magnetic bias layer for the free layer on the hard magnetic layer (see FIG. 5B).

Figure 5A:
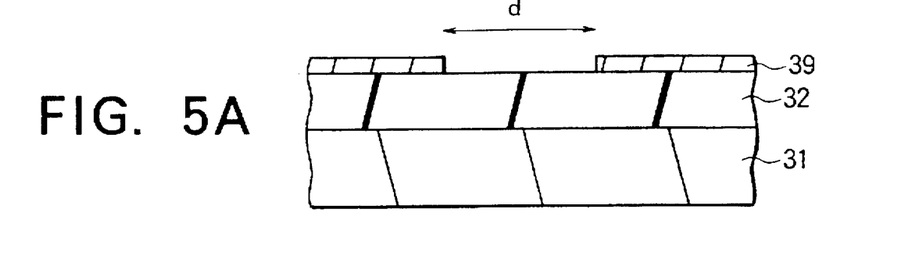
FIGS. 5A, 5B, 5C, and 5D are outlined sectional views for explaining manufacturing steps of the magnetoresistance effect device according to the third embodiment of the present invention.
Figure 5B:
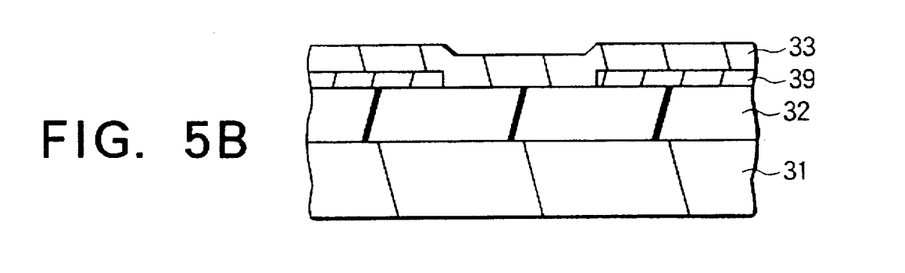

A conductor layer (34) is formed on the magnetoresistance effect film (33). As with the first embodiment, the conductor layer (34) is a laminate of Ta/Cu/Ta.

Figure 5C:
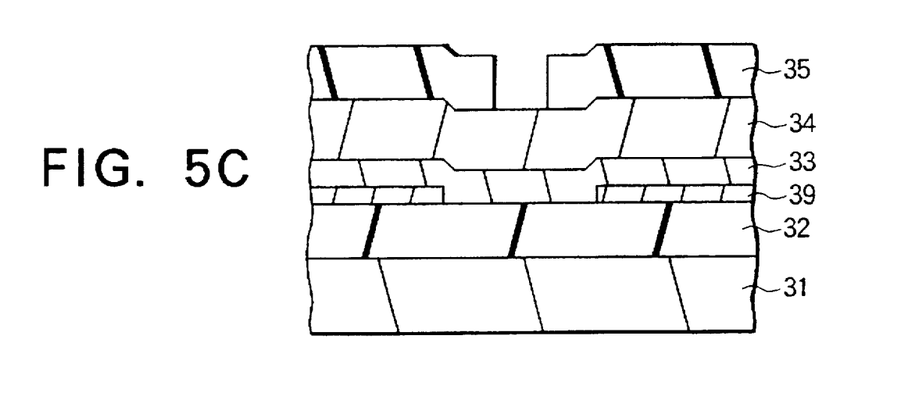
Figure 5D:
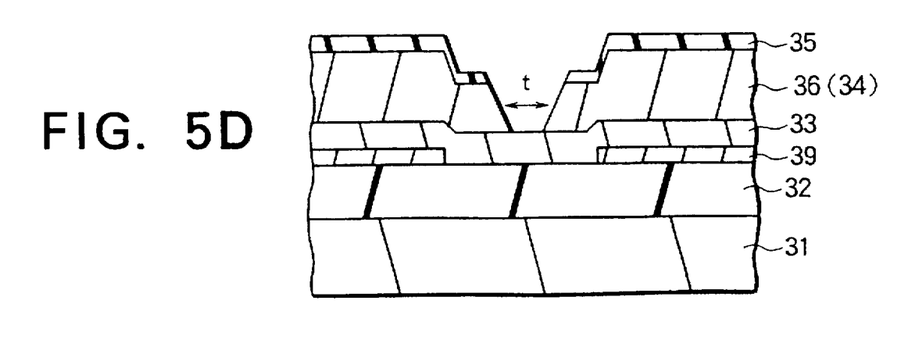

Thereafter, as with the first embodiment, a mask layer (35) composed of alumina with a thickness of 100 nm is formed (see FIG. 5C). With the patterned aluminum mask layer (35), the conductor layer (34) is ion-milled. In the ion-milling process, the ion incident angle is 40° and the distance between the leads (36) that contact the magnetoresistance effect film (33) is 1.0 µm. The side surfaces of the leads (36) are tapered for around 45°. After the ion-milling process is performed, the thickness of the remaining film of the resist layer (35) is around 20 nm (see FIG. 5D). By changing the milling angle, the taper angle can be changed.

Figure 6:
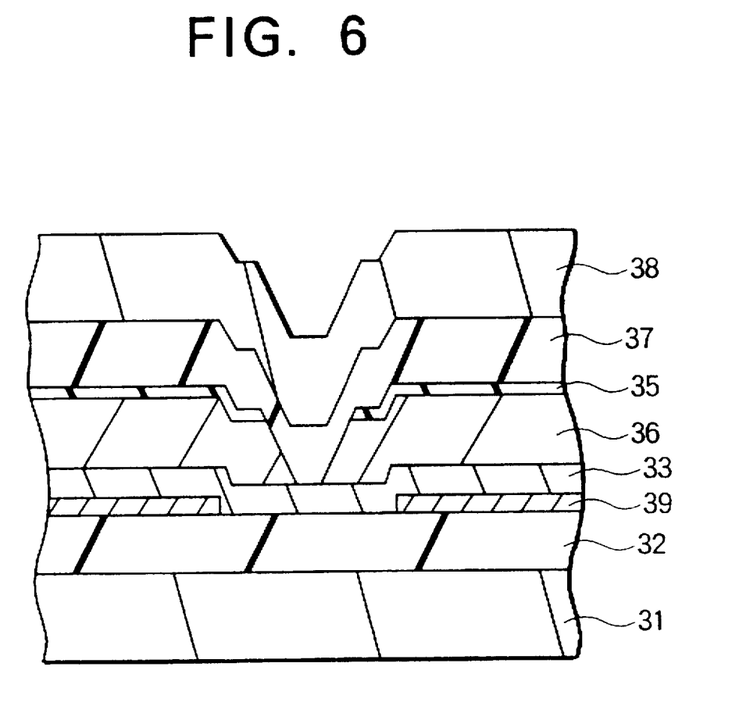
FIG. 6 is an outlined sectional view for explaining the magnetoresistance effect device according to the third embodiment of the present invention.

Thereafter, an alumina layer with a thickness of around 60 nm is formed as an upper gap layer (37) [magnetic gap layer]. A CoZrNb amorphous magnetic alloy layer with a thickness of around 2 µm is formed as an upper shield layer (38) [magnetic shield layer] on the upper gap layer (37).

With the above-described manufacturing steps, a shield type MR head is obtained (see FIG. 6).

Experimental results of characteristics of the reproducing head show that although the thickness of the magnetic gap layer is as small as 60 nm, the electric insulation characteristic among the upper gap layer (37), the magnetoresistance effect film (33), and the leads (36) are good and thereby the resultant reproducing head has a very high reliability. In addition, the experimental results show that a reproducing track width of 1 µm can be accomplished. Moreover, by changing the conditions, a reproducing track width of 0.7 µm can be also accomplished.

Fourth Embodiment

Figure 7A:
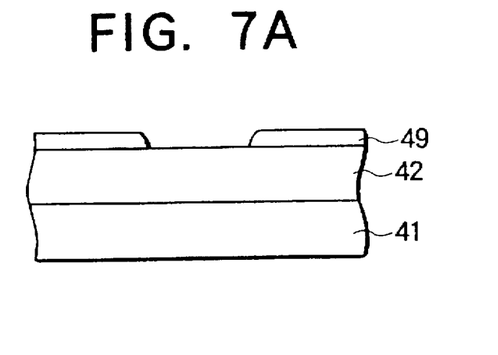
FIGS. 7A, 7B, and 7C are outlined views for explaining manufacturing steps of a magnetoresistance effect device according to a fourth embodiment of the present invention.
Figure 7B:
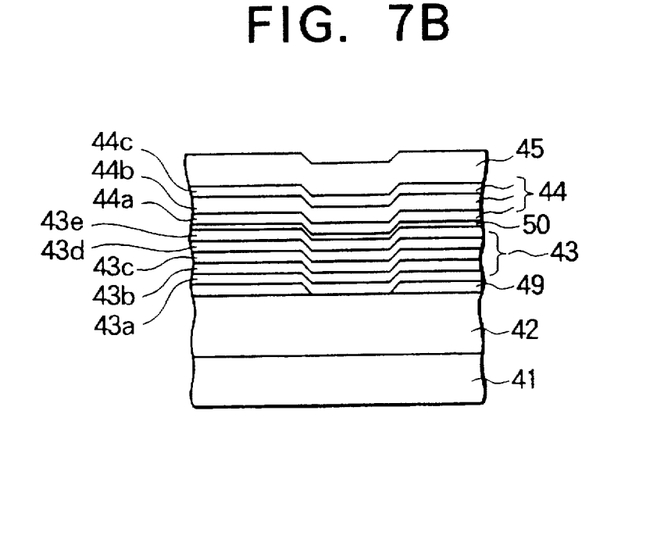

As with the third embodiment, an alumina layer (42) with a thickness of 0.1 µm is formed as a lower gap layer on a CoZrNb lower shield film (41). A CoPt film with a thickness of 20 nm is formed on the aluminum layer (42). The CoPt film is ion milled with a distance of 2 µm (see FIG. 7A). Thereafter, a CoZrNb layer (43a) with a thickness of 10 nm, a CoFe layer (43b) with a thickness of 2 nm, a Cu layer (43c) with a thickness of 3 nm, a CoFe layer (43d) with a thickness of 2 nm, and a FeMn layer (43e) with a thickness of 15 nm are formed as a spin valve film (43). After that, a spin valve protecting film Ti (50) with a thickness of 2 nm is formed. In addition, a Ta layer (44a) with a thickness of 20 nm, a Cu layer (44b) with a thickness of 80 nm, and a Ta layer (44c) with a thickness of 20 nm are formed as a lead (44). Thereafter, an alumina mask (45) with a thickness of 100 nm is formed (see FIG. 7B). When the lead and the spin valve film can be successively formed by the same unit, the Ta layer that contacts the Ti layer can be omitted.

Figure 7C:
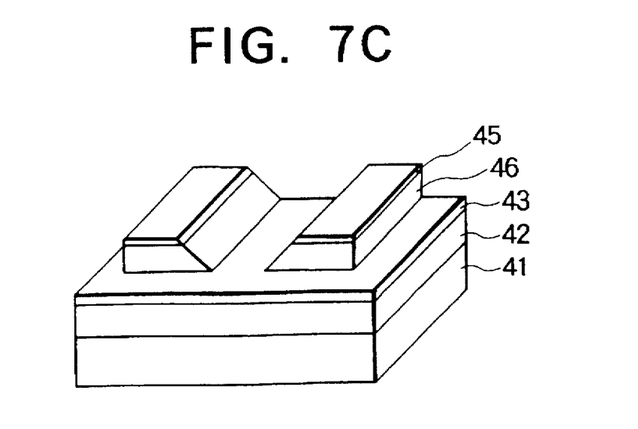

As with the first embodiment, the alumina mask (45) is processed by the RIE method so that the distance of the leads (46) becomes 1 µm (see FIG. 7C).

Figure 8A:
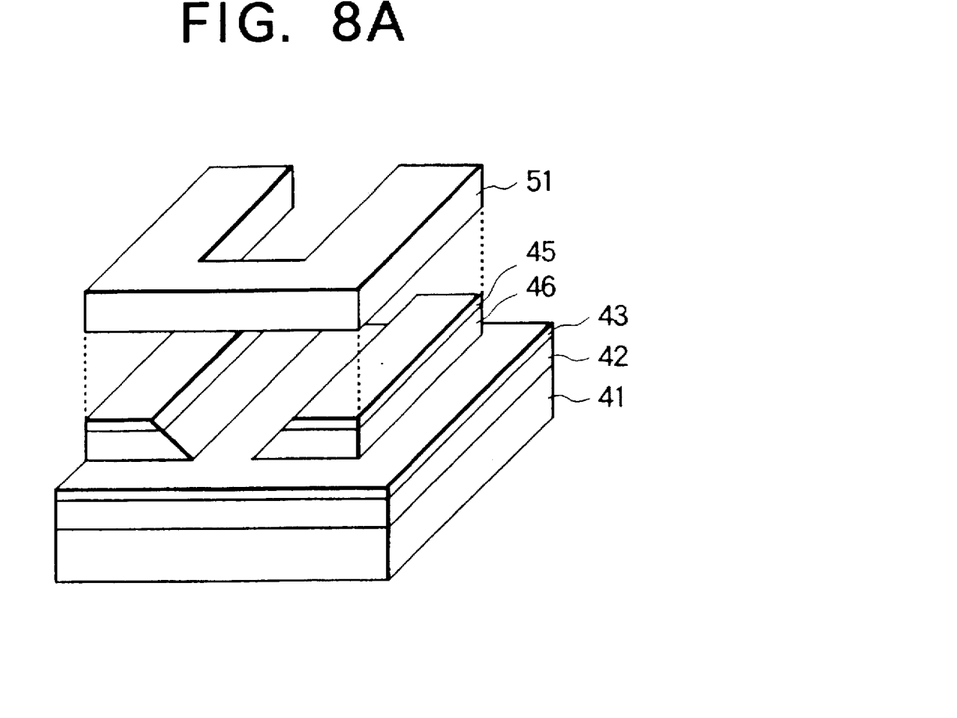
FIGS. 8A and 8B are outlined views for explaining the magnetoresistance effect device according to the fourth embodiment of the present invention.
Figure 8B:
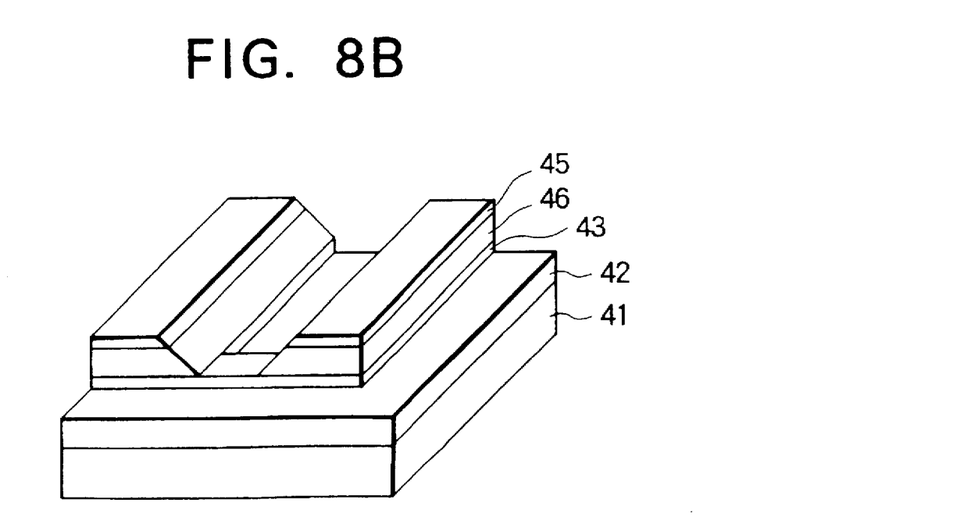

Thereafter, with a resist mask (51) in the shape of which the track and leads are connected, the leads are ion milled (see FIGS. 8A and 8B). The resist mask (51) may be a conventional organic resist or an inorganic resist such as alumina.

Next, as with the first embodiment, an upper gap and an upper shield are formed (not shown). At this point, to improve the adhesive characteristic of the gap layer, an adhesive layer may be disposed. For example, an adhesive layer composed of an amorphous Si layer with a thickness of around 100 Å, preferably 50 to 150 Å, (on the spin valve side) and a $SiO_2$ layer with a thickness of around 50 Å, preferably 20 to 100 Å, (on the gap layer side) may be disposed. In this case, since the total film thickness of the adhesive layer and the gap layer (for example, alumina layer) is the substantial film thickness of the gap layer, the thickness of the gap layer should be decreased corresponding to the thickness of the adhesive layer. Likewise, an adhesive layer may be disposed for the lower gap layer.

In FIG. 7C or later, each portion of the spin valve film (43) is merely denoted as the spin valve film (43). In FIG. 7C or later, the spin valve film (43) includes the CoPt film (49).

In addition to the effects of each of the above-described embodiments, in the fourth embodiment, since the spin valve layer is processed after the leads (46) are processed, the sectional surface of the spin valve layer and the CoPt step portion can be remarkably prevented from corroding. Moreover, the contact resistance between the spin valve and the leads can be decreased. Thus, the yield can be improved.

As described above, according to the present invention, a high reliability magnetoresistance effect device with high dielectric breakdown resistance can be obtained. Thus, in a magnetic recording drive (hard disk drive) with a magnetic disk and a reproducing head that uses the magnetoresistance effect device, a narrow gap and a narrow track can be effectively accomplished. Consequently, the present invention can remarkably contribute to the industry.

In the above-described embodiments, the ion-milling process was used, but a RIE process or CD (chemical dry etching) process may be used.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A magnetoresistance effect device, comprising:
 a magnetoresistance effect film;
 a pair of leads composed of a conductor layer for supplying a current to said magnetoresistance effect film;
 an insulation film formed in at least edge portions of said leads oppositely formed;
 a magnetic gap layer for coating the surface of said magnetoresistance effect film formed between said leads and said insulation film; and
 a magnetic shield layer formed on said magnetic gap layer.

2. The magnetoresistance effect device as set forth in claim 1, further comprising a magnetic bias layer formed on said magnetoresistance effect film.

3. The magnetoresistance effect device as set forth in claim 1, wherein said insulation film is composed of part of a mask layer for forming said leads.

4. The magnetoresistance effect device as set forth in claim 1, wherein said insulation film has a thickness of at least 5 nm.

5. The magnetoresistance effect device as set forth in claim 1, wherein said insulation film is composed of at least one selected from the group consisting of Al oxide, Si oxide, Ti oxide, Zr oxide, Al nitride, Si nitride and Ta nitride.

6. A manufacturing method of a magnetoresistance effect device, comprising the steps of:
 (a) forming a conductor layer on a magnetoresistance effect film;
 (b) forming a mask layer composed of an insulation layer with a predetermined pattern on the conductor layer;
 (c) ion-milling the conductor layer with the mask layer so as to form the conductor layer in a lead shape;
 (d) forming a magnetic gap layer composed of a nonmagnetic substance so as to coat the magnetoresistance effect film exposed in the step (c) and the remaining mask layer; and
 (e) forming a magnetic shield layer composed of a magnetic substance on the magnetic gap layer.

7. The manufacturing method as set forth in claim 6, further comprising the step of forming a magnetic bias layer on the magnetoresistance effect film so that the magnetic bias layer remains on the magnetoresistance effect film exposed in the step (c).

8. The manufacturing method as set forth in claim 6, wherein the ion incident angle in the step (c) is 20° to 80° from the vertical direction against the magnetoresistance effect film.

9. The manufacturing method as set forth in claim 6, wherein the mask layer is composed of at least one selected from the group consisting of Al oxide, Si oxide, Ti oxide, Zr oxide, Al nitride, Si nitride and Ta nitride.

10. The manufacturing method as set forth in claim 6, wherein the thickness of the mask layer in the step (b) is 300 nm or less.

* * * * *